US006954908B2

(12) United States Patent
Subasic et al.

(10) Patent No.: US 6,954,908 B2
(45) Date of Patent: Oct. 11, 2005

(54) CIRCUIT DESIGN POINT SELECTION METHOD AND APPARATUS

(75) Inventors: Pero Subasic, Pittsburgh, PA (US); Rodney Phelps, Pittsburgh, PA (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 10/315,437

(22) Filed: Dec. 10, 2002

(65) Prior Publication Data

US 2004/0111679 A1 Jun. 10, 2004

(51) Int. Cl.[7] .................................................. G06F 17/50
(52) U.S. Cl. .................................... 716/1; 716/8; 716/9
(58) Field of Search ..................................... 716/1, 8, 9

(56) References Cited

PUBLICATIONS

Esbensen et al., "Design Space Exploration Using the Genetic Algorithm", IEEE 1996.*

Esbensen, Henrik et al. (1996). "An MCM/IC Timing–Driven Placement Algorithm Featuring Explicit Design Space Exploration." *Proceedings of IEEE Multi–Chip Module Conference*, pp. 170–175.

Zbigniew, Michalawicz (1992). "Genetic Algorithms + Data Structures = Evolution Programs." *Springer–Verlag*, pp. 1–3.

* cited by examiner

*Primary Examiner*—A. M. Thompson
*Assistant Examiner*—Brandon Bowers
(74) *Attorney, Agent, or Firm*—Morrison & Foerster LLP

(57) ABSTRACT

A visualization and data mining technique can be utilized to facilitate analysis of generated sets of design points for an integrated circuit to enable easy and fast understanding of important properties of generated designs. The use of the visualization and data mining technique significantly reduces the time needed for analysis of design space and decision on which design point to choose for implementing into a circuit design.

19 Claims, 11 Drawing Sheets

| DESIGN | VARIABLES | | | | | GOALS | | | | | COST |
|---|---|---|---|---|---|---|---|---|---|---|---|
| POINT# | VI | V2 | V3 | • • • | VX | GI | G2 | G3 | • • • | GX | |
| DI | I | 2 | 3 | • • • | 4 | A | B | C | • • • | D | CI |
| D2 | 5 | 2 | 3 | • • • | 4 | A | B | C | • • • | D | C2 |
| D3 | I | 2 | 3 | • • • | 4 | X | B | C | • • • | D | C3 |
| ⋮ | ⋮ | | | | | ⋮ | | | | | ⋮ |
| DX | I | 2 | 3 | • • • | 8 | A | B | Y | • • • | D | C4 |

| DESIGN POINT# | VARIABLES | | | | | GOALS | | | | | COST |
|---|---|---|---|---|---|---|---|---|---|---|---|
| | V1 | V2 | V3 | • • • | VX | G1 | G2 | G3 | • • • | GX | |
| D1 | 1 | 2 | 3 | • • • | 4 | A | B | C | • • • | D | C1 |
| D2 | 5 | 2 | 3 | • • • | 4 | A | B | C | • • • | D | C2 |
| D3 | 1 | 2 | 3 | • • • | 4 | X | B | C | • • • | D | C3 |
| ⋮ | ⋮ | | | | | ⋮ | | | | | ⋮ |
| DX | 1 | 2 | 3 | • • • | 8 | A | B | Y | • • • | D | C4 |

FIG. 1

| GOAL | CONSTRAINT | TARGET VALUE |
|---|---|---|
| G1 | MINIMIZE | 0.1 |
| G2 | MINIMIZE | 0.02 |
| G3 | GREATER THAN | 50,000,000 |
| ⋮ | ⋮ | ⋮ |
| GX | LESS THAN | $5 \times 10^{-9}$ |

FIG. 2

| | AVERAGE | GOAL G1 | GOAL G2 | GOAL G3 | GOAL G4 | GOAL G5 |
|---|---|---|---|---|---|---|
| VARIABLE V1 | 0.01 | 0.02 | 0.02 | 0 | 0.01 | 0 |
| VARIABLE V2 | .0 | 0.81 | 0.01 | 0.31 | 0.02 | 0.02 |
| VARIABLE V3 | 0.01 | 0 | 0 | 0.05 | 0.1 | 0.02 |
| VARIABLE V4 | 0.01 | 0.02 | 0.02 | 0.01 | 0.04 | 0.82 |
| VARIABLE V5 | 0.06 | 0.08 | 0.08 | 0.1 | 0.02 | 0.09 |
| VARIABLE V6 | 0.07 | 0.05 | 0.05 | 0.06 | 0.13 | 0.1 |
| VARIABLE V7 | 0.07 | 0.06 | 0.06 | 0 | 0.04 | 0 |
| VARIABLE V8 | 0 | 0 | 0 | 0 | 0 | 0 |
| VARIABLE V9 | 0.01 | 0 | 0 | 0.16 | 0.1 | 0.08 |
| VARIABLE V10 | 0.04 | 0.01 | 0.01 | 0.39 | 0.18 | 0.01 |

| | AVERAGE | GOAL G20 | GOAL G21 | GOAL G22 | GOAL G23 | GOAL G24 |
|---|---|---|---|---|---|---|
| VARIABLE V15 | 0.02 | 0.18 | 0.37 | 0.47 | 0.05 | 0.15 |
| VARIABLE V16 | 0.11 | 0.08 | 0.31 | 0.32 | 0.34 | 0.17 |
| VARIABLE V17 | 0.03 | 0.19 | 0.28 | 0.21 | 0.09 | 0.05 |
| VARIABLE V18 | 0.01 | 0.22 | 0.11 | 0.09 | 0.06 | 0.23 |
| VARIABLE V19 | 0.03 | 0.02 | 0.05 | 0.05 | 0.05 | 0.05 |

CIRCUIT DESIGN POINT SELECTION METHOD AND APPARATUS

BACKGROUND OF THE INVENTION

1. Field of the Invention

The present invention relates to data mining and, more particularly, to a method of visually detecting relationships between values of related goals and variables of a plurality of design points of a circuit.

2. Description of Related Art

Heretofore, methods of generating analog circuit designs were based on synthesis programs implemented on a computer. Each synthesis program generates a set of design points for a circuit based upon design variables, design goals and constraints for the circuits. More specifically, each design point is determined from a common set of variables and a common set of goals for the circuit, with each design point having at least one variable or goal different from each other design point.

Each design point also has a cost or cost value associated therewith. The cost of each design point represents the quality of the design point with respect to a given set of goals, each having a target value and a constraint associated therewith. Design points where the goals better satisfy their design constraints have a lower cost associated therewith.

Depending on the type of circuit design and the user specified set of information that is input into the synthesis program, the number of design variables and goals vary from several hundred to several thousand. After a synthesis run is complete, a single combination of design variable values and design goal values, i.e., a single design point, is selected. This design point is used as a starting point for an implementation of the circuit on a semiconductor chip. In another application, a set of design points is generated by sampling in the vicinity of a chosen design point. This is typical when the existing "best" design needs to be improved or when it is desired to better understand local variations in the design variables and the design goals.

Given the large size of the set of design points and the number of variables and goals, it is difficult for a human designer to understand the advantages or disadvantages of selecting a particular design point. It is also difficult to focus on a desired subset of design points by using conventional inspection techniques, such as examining the numerical/textual output of the synthesis program or examining design points one by one. Even when using advanced database querying techniques, significant challenges remain in analyzing this large data set with the large number of design variables and design goals.

Accordingly, it is desirable to overcome the above problems and others by providing a visual data mining technique that enables analysis of the generated set of design points to provide an easy and fast understanding of important properties of the generated designs; fast, intuitive and easy selection of subsets of design points, or a single design point, with desired properties based on the analysis; and which significantly reduces the time for analysis of the design space and the decision on which design point to choose for practical implementation.

SUMMARY OF THE INVENTION

The invention is a method of selecting one of a plurality of circuit design points to utilize for implementing a circuit. The method includes providing a database having a plurality of design points for a circuit, with each design point determined as a function of a set of goals for the circuit and a set of variables for the circuit. Each design point has a value of at least one goal or one variable that is different from each other design point. A cost is determined for each design point as a function of the set goals for the circuit and, more particularly, as a function of the values of the set of goals for the design point. A cost versus design point chart is displayed having indicia at the intersection of each cost-design point pair. A plurality of indicia is selected in the cost versus design point chart. At least one of the following is displayed: (1) at least one goal variable chart that includes an indicia for the value of the goal and the value of the variable of each design point associated with the selected indicia in the cost versus design point chart; (2) a parallel goal coordinates chart having a plurality of spaced parallel axes each associated with one of the set of goals, with the range of values of each axis related to the range of values of the corresponding goal of the design points associated with the selected indicia in the cost versus design point chart, where the parallel goal coordinates chart includes for each design point associated with the selected indicia in the cost versus design point chart a line that extends through the parallel goal coordinates chart and intersects each axis at the value of a corresponding goal for the design point; and (3) a radar chart having at least three radially extending axes, with each axis representing one of the set of goals, where the radar chart includes a line for each design point associated with the selected indicia in the cost versus design point chart, with each design point line intersecting each axis of the radar chart at the value of the corresponding goal for the design point. One or more of the foregoing charts are utilized to determine which design point to utilize to implement the circuit.

The method can also include determining at least one of a sensitivity and a correlation for each goal-variable pair associated with each design point associated with the selected indicia in the cost versus design point chart. First and second goal-variable pairs are selected based on the sensitivity or the correlation therefor. First and second goal-variable charts are displayed that includes for each design point of the corresponding first and second goal-variable pairs an indicia related thereto. One of the indicia in the first goal variable chart is selected whereupon a first goal-variable pair of one of the design points is selected. Responsive to the selection of the indicia in the first goal-variable chart, the indicia corresponding to the same design point is highlighted in the second goal-variable chart.

A constraint can be associated with at least one goal of a design point. Each design point can be classified as feasible where each constraint of the design point is satisfied. Each design point can be classified as infeasible where at least one constraint of the design point is not satisfied.

The method can also include selecting one goal-variable pair of the set of goals and the set of variables associated with at least the design points associated with a selected indicia. For each design point associated with this selected indicia, the value of the goal and the value of the variable of the selected goal-variable pair can be determined. Variables of a best fit curve equation that represent a best fit line for the thus determined goal and variable values of each design point can be determined. The sensitivity of the selected goal-variable pair can be determined as the function of the best fit line. Also or alternatively, the correlation of the selected goal-variable pair can be determined as a function of the distribution of the goal and variable values of the one goal-variable pair for each design point about the best fit line.

The invention is also a computer readable medium having stored thereon instructions which, when executed by a processor, cause the processor to display a cost versus design point graph that includes an indicia at the intersection of each cost-design point pair for a circuit. Each design point is determined as a function of a common set of variables and a common set of goals for the circuit where a value of at least one variable or goal of each design point is different from the values of the variables in goals for each other design point. Each cost is determined as a function of the values of the goals for the corresponding design point. A selection of a plurality of indicia in the cost versus design point graph is received and at least one chart is displayed having one of an indicia and a line for each design point associated with the selected indicia in the cost versus design point chart. The at least one chart includes axes for (1) one goal-variable pair; (2) plural goals of the set of goals; or (3) one cost-goal pair. The at least one displayed chart enables selection of one of the design points to utilize for implementing the circuit.

The instructions can also cause the processor to display a goal versus variable matrix for the design points associated with the selected indicia. The goal versus variable matrix includes in each cell thereof at least one of a sensitivity value and a correlation value for the corresponding goal-variable pair. A selection of first and second goal-variable pairs can be received in the goal-variable matrix. In response to receiving this selection, first and second goal-variable chart can be displayed, with each goal-variable chart including for the goal-variable pair represented thereby an indicia at the intersection of the value of the goal and the value of the variable of each design point associated with the selected indicia in the cost versus design point chart. A selection of one of the indicia in the first goal-variable chart can be received whereupon one of the design points is selected. In response to receiving this selection, the indicia in the second goal-variable chart where the value of the goal and the value of the variable for the same design point is highlighted.

The instructions can also cause the processor to receive a selection of at least one goal-variable pair of the set of goals and the set of variables associated with the design points associated with the indicia selected in the cost versus design point chart. For the selected goal-variable pair, the value of the goal and the value of the variable for each design point associated with the indicia selected in the cost versus design point chart can be identified. Variables of a best fit curve equation that represent a best fit line for the thus identified goal and variable values of each design point associated with the indicia selected in the cost versus design point chart can be determined for the selected goal-variable pair. The sensitivity of the selected goal-variable pair can then be determined as a function of the best fit line. Also or alternatively, the correlation of the selected goal-variable pair can be determined as a function of the distribution about the best fit line of the goal and variable values of the one goal-variable pair of each design point associated with indicia selected in the cost versus design point graph.

The chart of plural goals of the set of goals can include a coordinate axis for each of at least three goals of the circuit, with the coordinate axes having a predetermined relation to each other. The graph can also include for each design point associated with the indicia selected in the cost versus design point graph a line that intersects each coordinate axis at a value that corresponds to the value of the corresponding goal for the design point. The graph of plural goals of the set of goals can include a parallel goal coordinates chart having the axes positioned in spaced parallel relation or a radar chart having the axes extending radially from a common center.

Lastly, the invention is a method of selecting one of a plurality of circuit design points to utilize for implementing a circuit. The method includes providing a database having a plurality of design point for a circuit. Each design point is determined as a function of a common set of goals for the circuit and a common set of variables for the circuit. Each design point has a value of at least one goal or one variable different than each other design point. A set of design points is selected and one of the goals is selected. The values of the selected design points for the selected goal are grouped into at least two groups as a function of the proximity of the values to each other. One of the groups of values is selected whereupon their design points are selected.

The values of the selected group of values can be grouped into at least two groups as a function of the proximity of the values to each other. Thereafter, the selection of one of the groups of values and the subsequent grouping of the thus selected groups are repeated a desired number of times.

BRIEF DESCRIPTION OF THE DRAWINGS

FIG. 1 is a chart of design points, variables, goals and costs with associated values in each cell thereof;

FIG. 2 is a chart of constraints and target values for the goals of FIG. 1;

DETAILED DESCRIPTION OF THE INVENTION

The present invention will be described with reference to the accompanying figures where like reference numbers correspond to like elements.

The present invention is embodied in a computer software computer program which can be configured to run on a general propose computer or work station of the type known in the art. Generally, the present invention utilizes graphical techniques to visually display data regarding a plurality of design points for a circuit generated by a synthesis program implemented on a computer.

With reference to FIG. 1, the synthesis program utilizes a common set of variables V1, V2, V3, etc., and a common set of goals G1, G2, G3, etc., for determining design points D1, D2, D3, etc., for a circuit. More specifically, for each design point D, an appropriate value is associated with each variable V and each goal G wherefrom the synthesis program determines the performance characteristics of the circuit for these variables V and goals G. The combination of the values of the variables V and the goals G along with the corresponding performance characteristics of the circuit represent the design point for the values of the variables V and the goals G. Stated differently, each design point is a function of the values of the variables V and the goals G utilized to determine said design point.

Each design point also has a cost C1, C2, C3, etc., associated therewith. A general form algorithm for determining the cost of each design point is shown in the following equation (EQ1). However, it is to be appreciated that other suitable algorithms can be utilized to determine the cost of each design point.

$$Cost = \sum_{i=1}^{n} f(G_i)(w_i)$$

where i=design point number;

n=total number of design points;

$G_i$ are goals related to the cost;

$w_i$ are weights used to weigh the contribution of each goal; and $f(G_i)$ is an objective function that is utilized to determine the extent to which the corresponding goal is satisfied.

With reference to FIG. 2, and with continuing reference to FIG. 1, each goal G has associated therewith a design constraint that places a restriction or requirement on a target value for the goal. In FIG. 2, the column "Target Value" includes comparison values and the column "Constraint" contains comparison operators. The comparison operator "minimize" (or "maximize") means that the value of the corresponding goal should be minimized (or "maximized") and the target value for that goal is given only as a suggestion to the synthesis program. Constraints can have one of the following operators: minimize, maximize, less than and greater than.

Figure 3:
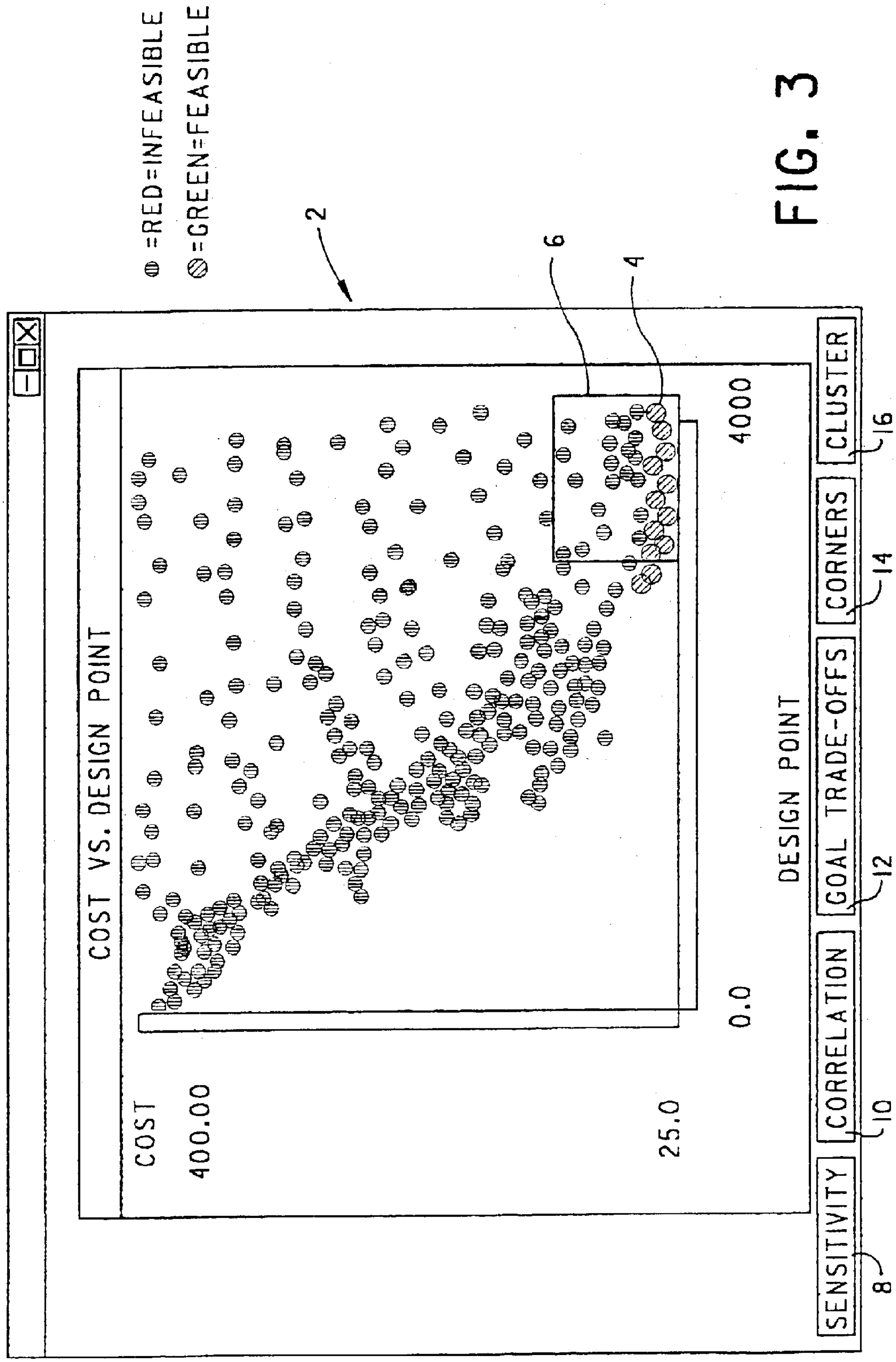
FIG. 3 is a cost versus design point chart for the costs and design points shown in FIG. 1.

With reference to FIG. 3, and with continuing reference to FIG. 1, a plurality of design points generated by the synthesis program are stored in a design database. At an appropriate time, a designer can launch a cost versus design point chart 2 that includes indicia 4 at the intersection of each cost and its design point. Indicia 4 having a first appearance or color, e.g., red, represents infeasible design points while indicia 4 having a second appearance or color, e.g., green, represents feasible design points. A feasible design point is one where the constraints associated with the goals of the design point can be met. In contrast, an infeasible design point is one where at least one constraint of one goal cannot be met.

Next, utilizing appropriate techniques, a designer selects a region 6 of design points to explore. Once region 6 is selected, the designer can perform a sensitivity analysis, a correlation analysis, a goal trade-off analysis, a corners analysis and/or a cluster analysis. The use of all or part of these analyses and the order in which they are utilized are not fixed.

If, as a result of one or more of the foregoing analyses, the "best" design point is found, the design process is finished. Otherwise, the designer can make adjustments to the values of the variables and/or the goals based upon observations about the current design space, and the synthesis program can be run again with these adjustments. This other synthesis run can be initiated from the beginning of the design evaluation process, or may generate design points in addition to the existing design points. This process is repeated until the "best" design point is found.

Cost versus design point chart 2 includes a sensitivity button 8, a correlation button 10, a goal trade-off button 12, a comers button 14 and a cluster button 16 which the designer can select in any order to display a corresponding chart, graph or matrix that can be utilized by the designer for elevating design points. The response of the computer software to the activation of each of these buttons 8 to 16 will now be described.

Figure 4:
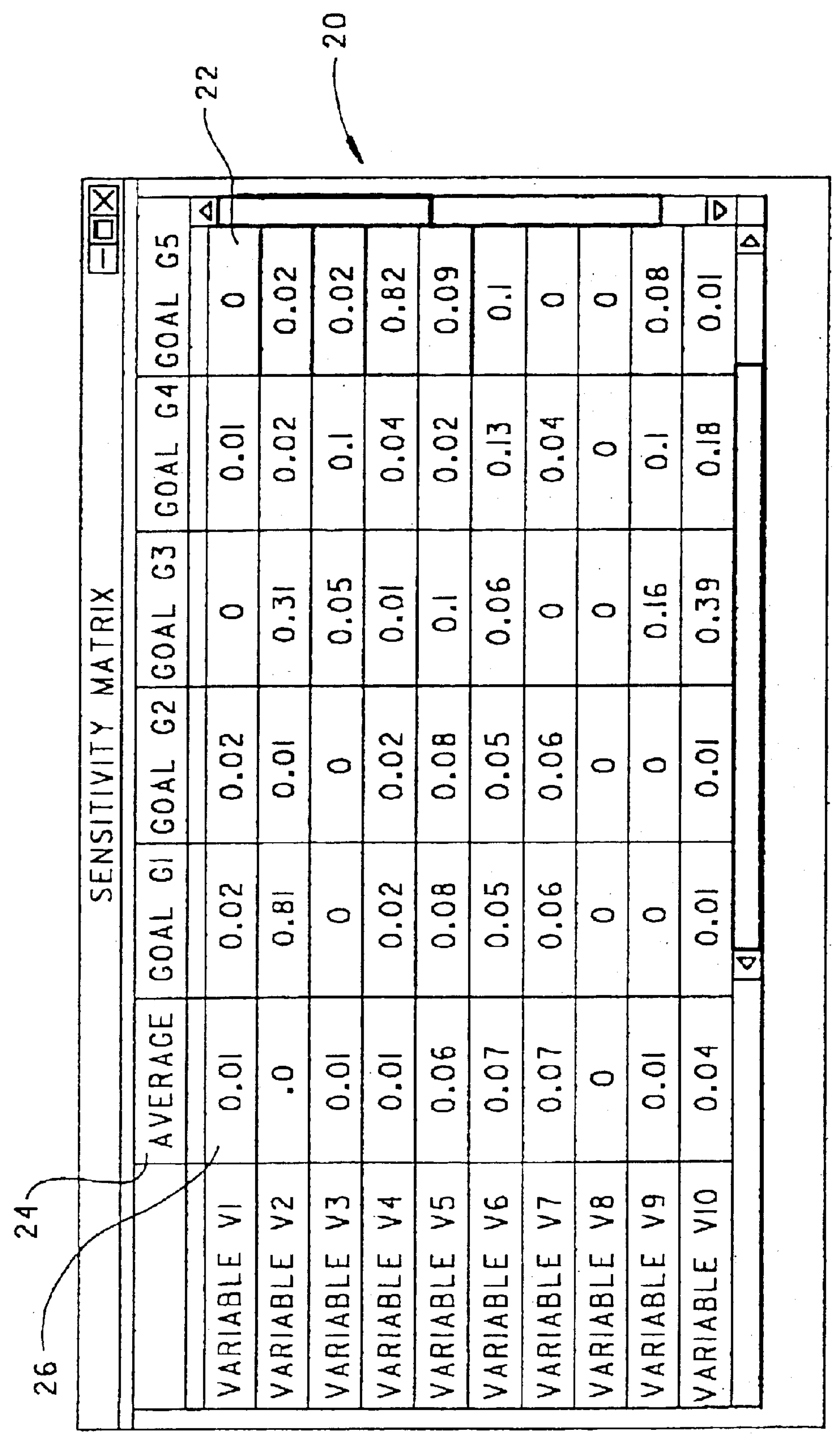
FIG. 4 is a sensitivity matrix for each goal-variable pair in FIG. 1.

With reference to FIG. 4, and with continuing reference to FIGS. 1 and 3, in response to selecting sensitivity button 8, a sensitivity matrix 20 is displayed. Sensitivity matrix 20 includes a matrix of sensitivity cells 22 for the values of the goal G and variable V for each goal-variable pair utilized to determine each design point D in FIG. 1. Each sensitivity cell 22 includes a value that represents a sensitivity of the corresponding goal G to the corresponding variable V, or vice versa. Sensitivity matrix 20 can also include an "Average" column 24 having average cells 26 therein where the value included in each average cell 26 is the average of the values of the goals G for the corresponding variable V. For example, the value 0.01 included in the cell at the intersection of Variable V1 and "Average" column 24 is the average of the values included in sensitivity cells 22 for each goal G associated with Variable V1.

The sensitivity value included in each sensitivity cell 22, i.e., each cell at the intersection of a variable V and a goal G, can be determined utilizing the following equation (EQ2) or any other suitable equation:

$$S=S_{xy}/S_{xx} \qquad \text{EQ2:}$$

where $$S_{xy} = \sum_{i=1}^{n} x_i y_i - (\Sigma x_i)(\Sigma y_i)/n;$$

$$S_{xx} = \sum_{i=1}^{n} x_i^2 - (\Sigma x_i)^2/n;$$

S=sensitivity;

i=design point number;

n=total number of design points;

$x_i$=variable value of design point i; and $y_i$=goal value of design point i.

The sensitivity value for each goal-variable pair is determined utilizing equation EQ2 for the goal and variable values for each design point D shown in FIG. 1. For example, for the goal-variable pair G1-V1, the value of goal G1 and variable V1 values for each design point D are utilized in equation EQ2 to determine the sensitivity for goal variable pair G1-V1.

The value included in each sensitivity cell 22 represents the extent to which the goal changes when the variable changes its value for a unit interval. The value of sensitivity S for each goal-variable pair is a number between ±1.0. A high sensitivity value, i.e., one that is closer to +1 or −1, means that the value of the goal changes significantly for small changes in the value of the variable. In contrast, a low sensitivity value, i.e., one closer to 0, means that changes of the value of the goal are small or negligible for changes in the value of the variable.

Each cell 22, 26 can be color coded depending on its sensitivity value such that when the absolute sensitivity value is close to ±1.0, the cell color is brighter. This color coding enables easy identification of entries with higher sensitivity values in the matrix.

Utilizing suitable techniques, each row or column can be individually selected to display sensitivity values in increasing or decreasing order. For example, the designer can sort on average sensitivity values to obtain variables V that have the strongest average impact on all goals G. Moreover, utilizing appropriate techniques, columns of sensitivity matrix 20 can be moved freely so that goals G in which the designer is most interested can be brought close together and their sensitivities analyzed.

Figure 5:
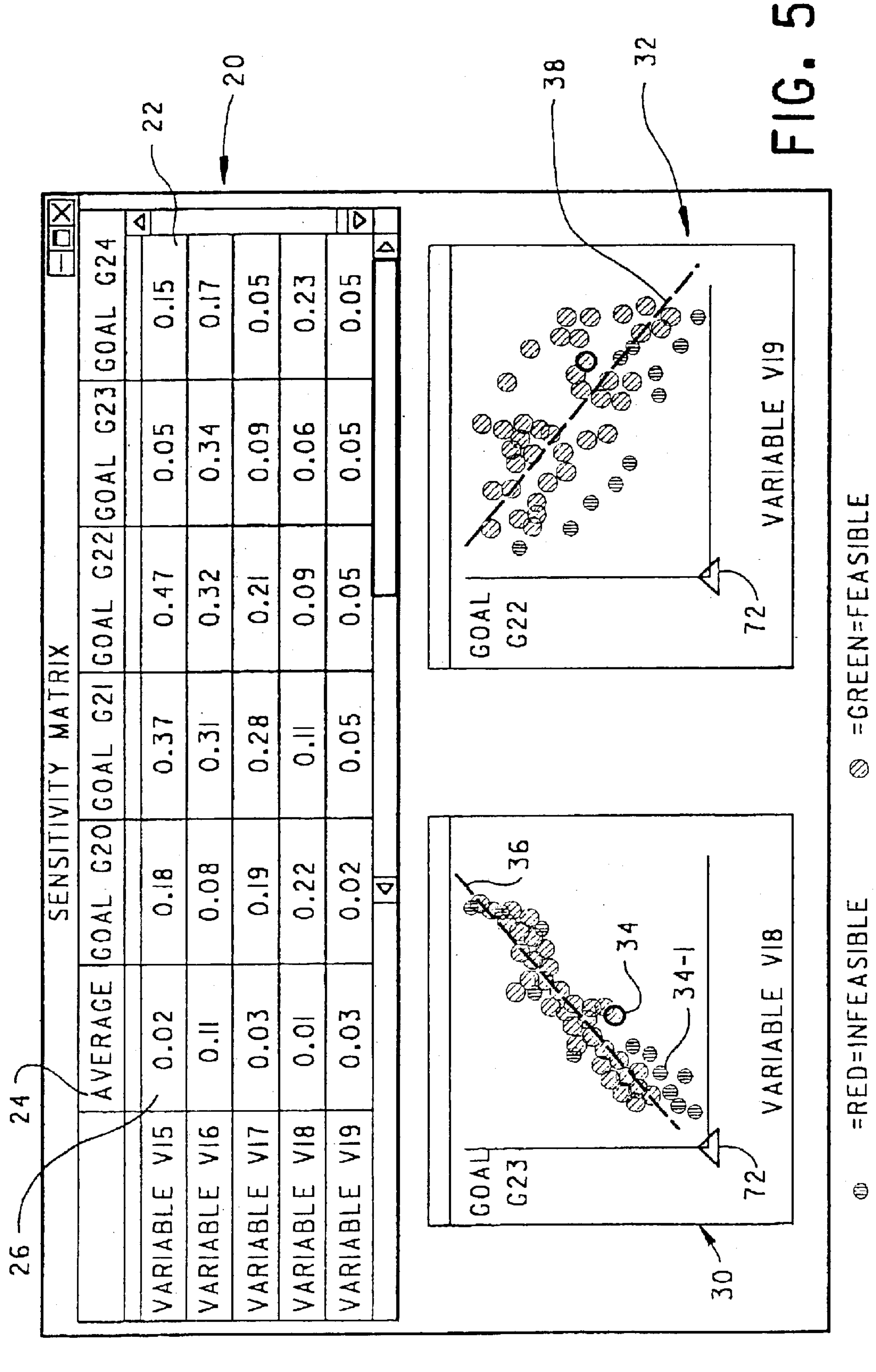
FIG. 5 is a portion of the sensitivity matrix of FIG. 4 and goal-variable charts displayed in response to selecting cells in the sensitivity matrix.

With reference to FIG. 5, and with continuing reference to FIGS. 1 and 4, utilizing appropriate techniques, one or more sensitivity cells 22 can be selected. For each sensitivity cell 22 selected, a corresponding goal-variable chart is displayed. For example, in response to selecting the sensitivity cell 22 at the intersection of goal-variable pair G23-V18 in FIG. 5, a goal-variable chart 30 is displayed. Similarly, in response to selecting the sensitivity cell 22 at the intersection of goal-variable pair G22-V19, a goal-variable chart 32 is displayed. Similarly, selecting any other sensitivity cell 22 causes a corresponding goal-variable chart to be displayed.

Each goal-variable chart 30 and 32 includes a plurality of indicia 34, each of which represents a design point D in FIG. 1. More specifically, the indicia 34 for each design point D is located in each goal-variable chart 30 and 32 at the intersection of the value for the goal and the value of the variable for the design point D in the chart. For example, suppose that indicia 34-1 in goal-variable chart 30 relates design to point D1. The position of indicia 34-1 in goal-variable chart 30 is based upon the value of goal G23 and the value of variable V18 for design point D1. Similar comments apply in respect of all other indicia 34 in goal-variable charts 30 and 32.

The slopes of imaginary lines 36 and 38 formed by indicia 34 in goal-variable charts 30 and 32, respectively, are higher for higher sensitivity values and lower for lower sensitivity values. A positive sloping line 36 or 38 indicates a direct relationship between the goal-variable pair and a negative sloping line 30 or 32 indicates an inverse relationship between the goal-variable pair. By evaluating goal-variable charts 30 and 32, a designer can access the sensitivity of each goal-variable pair that has been selected in the sensitivity matrix.

Figure 6:
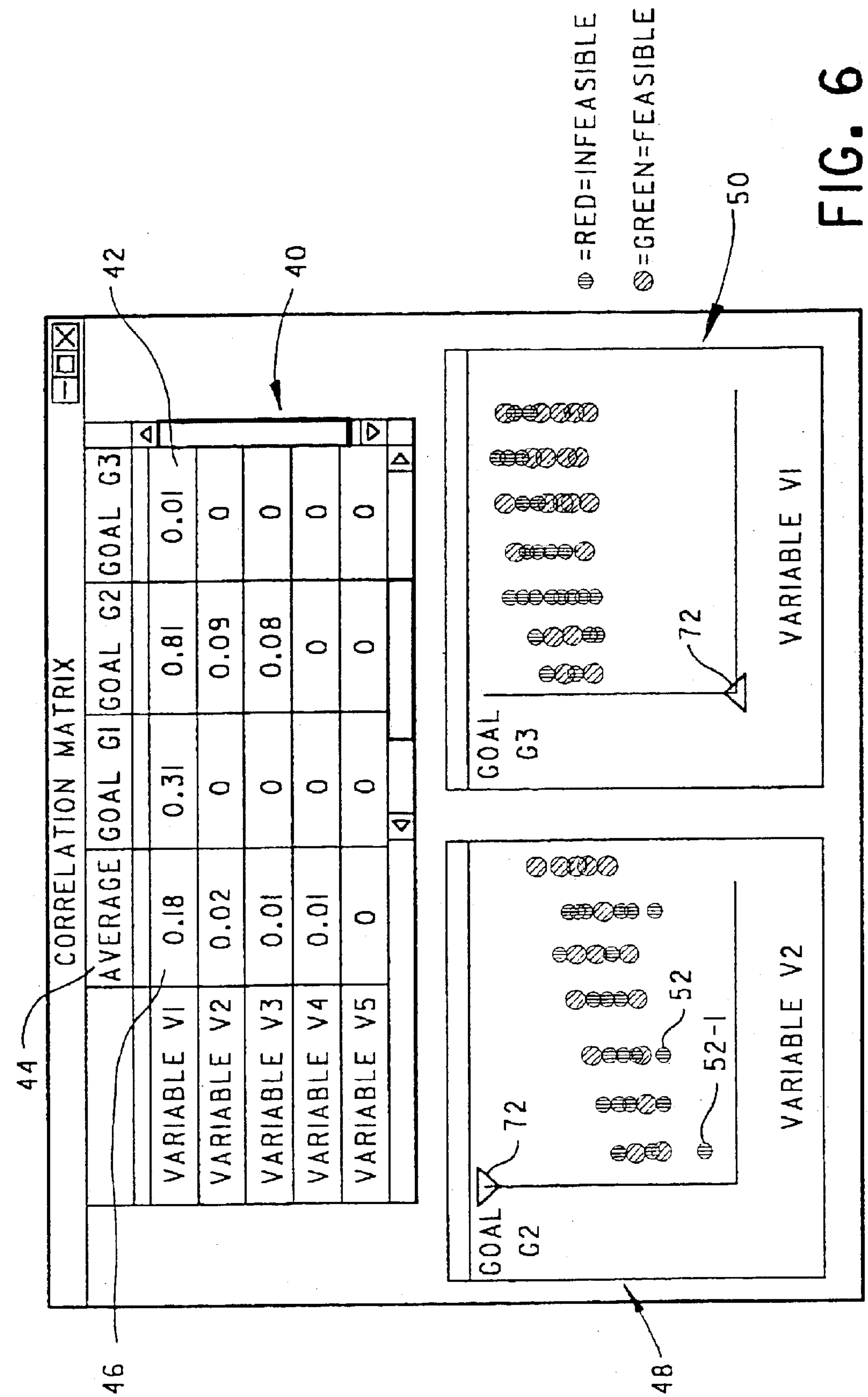
FIG. 6 shows a portion of a correlation matrix and a first set of goal-variable charts displayed in response to selecting cells in the correlation matrix.
Figure 7:
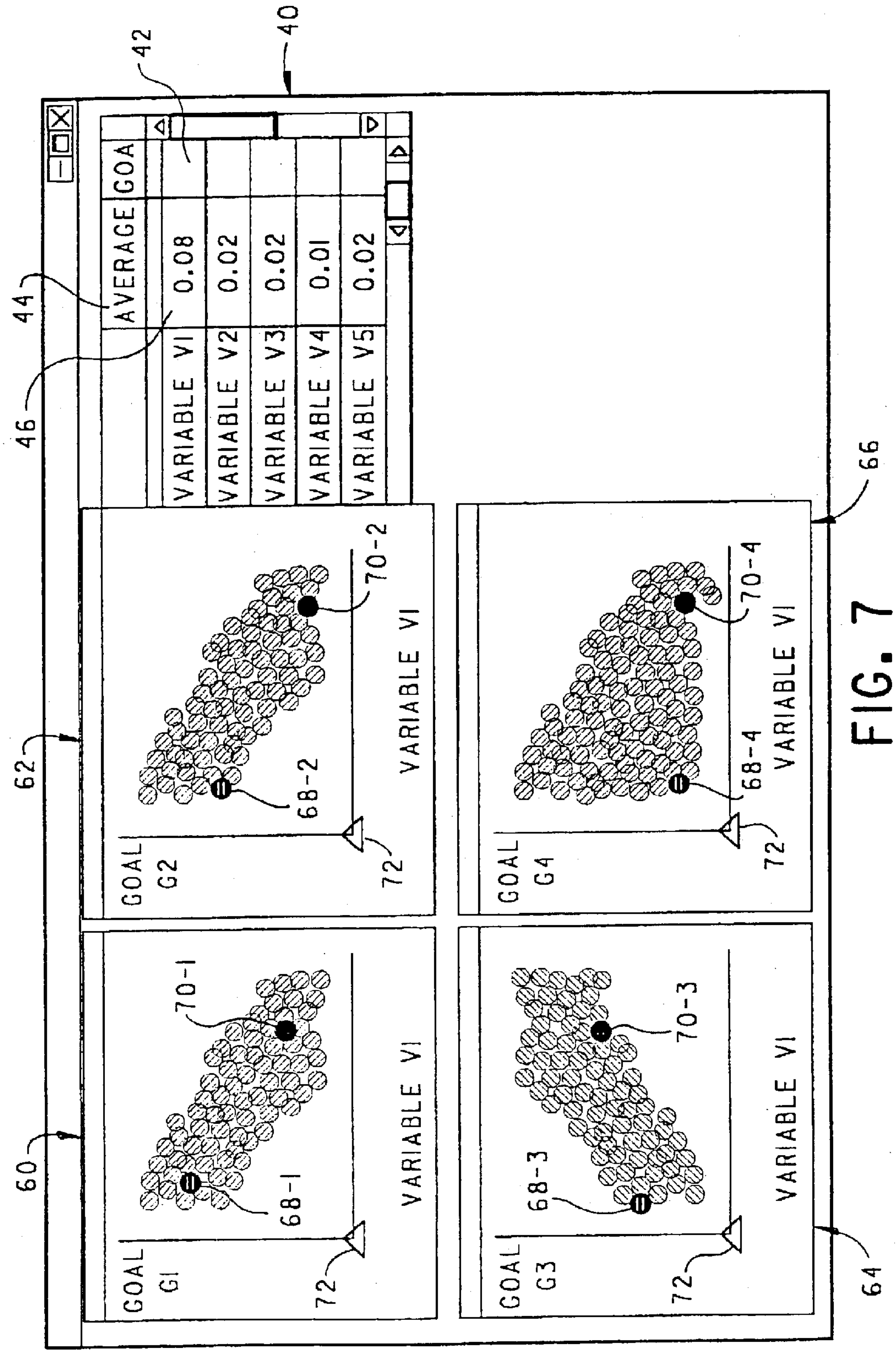
FIG. 7 shows a portion of the correlation matrix and a second set of goal-variable charts displayed in response to selecting cells in the correlation matrix.

With reference to FIGS. 6 and 7, and with continuing reference to FIGS. 3 and 1, in response to the selection of correlation button 10 in cost versus design point chart 2, a correlation matrix 40 is displayed. Correlation matrix 40 includes a correlation cell 42 for each goal-variable pair of the goals G and variables V utilized to determine each design point D in FIG. 1. Correlation matrix 40 also includes an "Average" column 44 in which the average cells 46 are arranged. Each average cell 46 includes a value that is the average of the correlation values of the goals G for the corresponding variables V. The correlation for each selected goal-variable pair can be determined utilizing the following equation (EQ3) or any other suitable equation:

$$r = S_{xy}/(S_{xx}S_{yy})^{1/2} \quad \text{EQ3:}$$

where $$S_{xy} = \sum_{i=1}^{n} x_i y_i - (\Sigma x_i)(\Sigma y_i)/n;$$

$$S_{xx} = \sum_{i=1}^{n} x_i^2 - (\Sigma x_i)^2/n;$$

$$S_{yy} = \sum_{i=1}^{n} y_i^2 - (\Sigma y_i)^2/n;$$

r=correlation;
i=design point number;
n=total number of design points;
$x_i$=variable value of design point i; and
$y_i$=goal value of design point i.

The correlation value for each goal-variable pair is determined utilizing equation EQ3 for the goal and variable values for each design point D shown in FIG. 1. For example, for the goal-variable pair G2-V2, the goal G2 and variable V2 values for each design point D are utilized in equation EQ3 to determine the correlation r for the goal-variable pair G2-V2.

As shown in FIG. 6, in response to selecting correlation cell 42 at the intersection of a goal-variable pair, a corresponding goal-variable chart having indicia related to each design point is displayed. For example, in response to selecting correlation cells 42 at the intersections of goal-variable pairs G2-V2 and G3-V1, goal-variable charts 48 and 50 are displayed having indicia 52 corresponding to each design point D in FIG. 1. For example, suppose that indicia 52-1 in goal-variable chart 48 corresponds to design point D1. In this case, the location of indicia 52-1 in goal-variable chart 48 is based on value of variable V2 for design point D1 and the value of goal G2 for design point D1. Similar comments apply in respect of the position of the other indicia 52 in each goal-variable chart 48 and 50. In FIG. 6, groups of indicia 52 are shown aligned in columns. This can occur when the values of variables V2 and V1 have discrete values. However, this is not to be construed as limiting the invention since the values of variables V1 or V2 can vary continuously whereupon indicia 52 in charts 48 or 50 can be arranged in a scatterplot arrangement like indicia 34 shown in FIG. 5.

As can be seen, sensitivity matrix 20 and correlation matrix 40 are organized in the same manner. The only difference is that the values displayed in correlation matrix 40 represent correlation values for each goal-variable pair, and their range is between 0.0 and 1.0, with 0.0 representing a low correlation and with 1.0 representing a high correlation value. Each correlation value indicates the degree of linearity between the value of the goal and the value of the variable for the corresponding goal-variable pair.

A designer can evaluate goal-variable charts 48 and 50 to determine the linearity of the relationship between the corresponding goal-variable pair. This information aids the designer in selecting a suitable design point for implementation.

Since both similarity and correlation information are relevant, sensitivity matrix 20 and/or goal-variable charts 30 and 32 can alternatingly be displayed with correlation matrix 40 and/or goal-variable charts 48 and 50 in a manner known in the art. Alternatively, correlation values and sensitivity values can be displayed together in the same cell of a combination sensitivity/correlation matrix (not shown). Selecting one of the cells of this sensitivity/correlation matrix can cause a goal-variable chart for sensitivity values and/or a goal-variable chart for correlations to be displayed for use by the designer.

With reference to FIG. 7, utilizing goal-variable charts of the type shown in FIG. 5 or 6, a designer can utilize the present invention to gain an understanding about goal and variable changes when a different design point is selected. For example, the designer can select a plurality of correlation cells 42 for goals of a single variable. For example, the designer can select goals G1, G2, G3 and G4 for variable V1. In response to selecting these correlation cells 42, goal-variable charts 60, 62, 64 and 66 are displayed. Similar comments apply in respect of the selection of a plurality of sensitivity cells 22 for goals of a single variable.

Corresponding indicia in charts 60 to 66 can be linked. Hence, in response to selection of an indicia 68-1 in chart 60, indicia 68-2, 68-3 and 68-4 for the same design point are highlighted in charts 62 to 66. Similar comments apply in respect of selecting indicia 34; 52; or 68 in any of charts 30 and 32; 48 and 50; and 60 to 66 and highlighting indicia for the corresponding design point in one of the other charts 30 and 32; 48 and 50; and 60 to 66, respectively. The size of each indicia 34, 52 and 68 can be related to the cost of the design point represented thereby. For example, the size of the indicia can be inversely proportional to the cost. Each chart 30, 32, 48, 50 and 60 to 66 can include an indicator 72 that points in the direction of feasible goal values. The indicator 72 in each chart can be color coded so that a first color represents a strict constraint (greater than or less than) and a second color represents a preferential constraint (maximize or minimize).

The designer can also highlight in one of charts 60 to 66 an indicia 70 that represents an end point for the analysis whereupon corresponding indicia for the same design point are highlighted in the other charts. The highlighting of indicia 70 in each chart 60 to 66 can be utilized to avoid the designer from analyzing undesirable design points.

By observing changes in goal and variable values in this way for several design points, the designer can gain an understanding of changes in the design space and select a design point that best satisfies the design specification. From the example shown in FIG. 7, it can be seen that the same change in a variable value can cause very different changes in different goal values. Also, the change in goal values does not always follow a general relationship, e.g., linear relationship, suggested by observing all points in charts 60 to 66.

Figure 8:
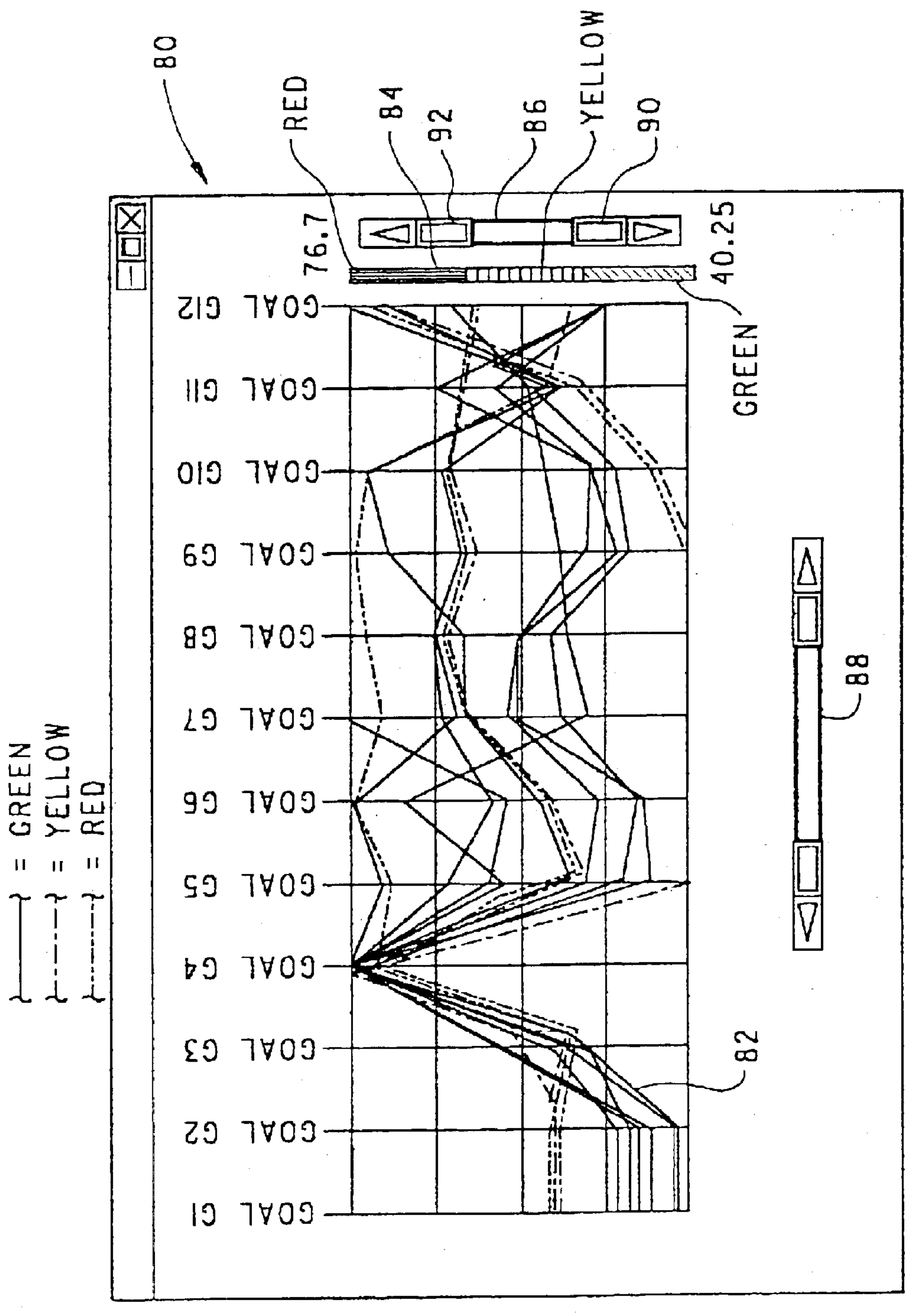
FIG. 8 is a parallel goal coordinates chart that displays relationships between goals of design points in FIG. 1.

With reference to FIG. 8, and with continuing reference to FIG. 3, in response to selecting goal-trade off button 12, a parallel goal coordinates chart displays multiple goal values on parallel axes. Each line 82 in chart 80 represents a single design point. Each line 80 is color coded to indicate the cost associated therewith. The key to the color code is given in a color bar 84. The range of cost values displayed on chart 80 can be selected by moving a cost range slider 86 adjacent color bar 84 upwardly or downwardly until the desired range of cost values is displayed. A slider 88 enables adjustment of which goals are displayed in chart 80. Desirably, all goals are displayed. The range of each goal axis in FIG. 8 is determined from the data currently displayed. Hence, each goal axis can have a different data range.

Utilizing parallel goal coordinates chart 80, a designer can observe general trends in data with respect to their cost and goal values. Lines 82 having a first color, e.g., green, (indicated by a solid line) indicate lower cost. By following each line 82 having the first color, a designer can observe changes of individual goals for more acceptable design points. Similarly, by following each line having a second or a third color, e.g., yellow (indicated by a dash-dot-dash line) or red (indicated by a dash-dot-dot-dash line), the designer can observe goal trends and changes for less desirable design points.

The designer can also observe relationships between adjacent goals in the chart and determine whether direct or inverse relationships between goals exist by observing whether lines 82 are parallel (direct relationship) or crossed (inverse relationship). Each goal axis in parallel goal coordinates chart 80 can be dragged to an arbitrary position within the chart utilizing suitable techniques. This facilitates comparison of any two goals even if the goal axes were not initially adjacent.

As discussed above, moving cost-range slider 86 upwardly or downwardly applies visual filtering to the data displayed in parallel goal coordinates chart 80. For example, moving slider 90 upwardly toward slider 92 decreases the range of costs displayed in chart 80 by increasing the value of the lowest cost displayed. Conversely, moving slider 92 toward slider 90 decreases the range of costs displayed on chart 80 by decreasing the value of the greatest cost displayed. Still further, sliders 90 and 92 can be moved toward each other so that the range of cost displayed on chart 80 decreases as a result of decreasing the greatest cost displayed in response to moving slider 92 downward and by increasing the least cost displayed in response to moving slider 90 upward.

Using cost-range slider 86, the number of design points displayed on chart 80 can be reduced significantly thereby making analysis of individual lines 82 (design points) easier. To this end, utilizing suitable techniques, a single line can be selected whereupon the goal closest adjacent the point where the line was selected and the cost for the selected design point can be displayed (not shown).

Figure 9:
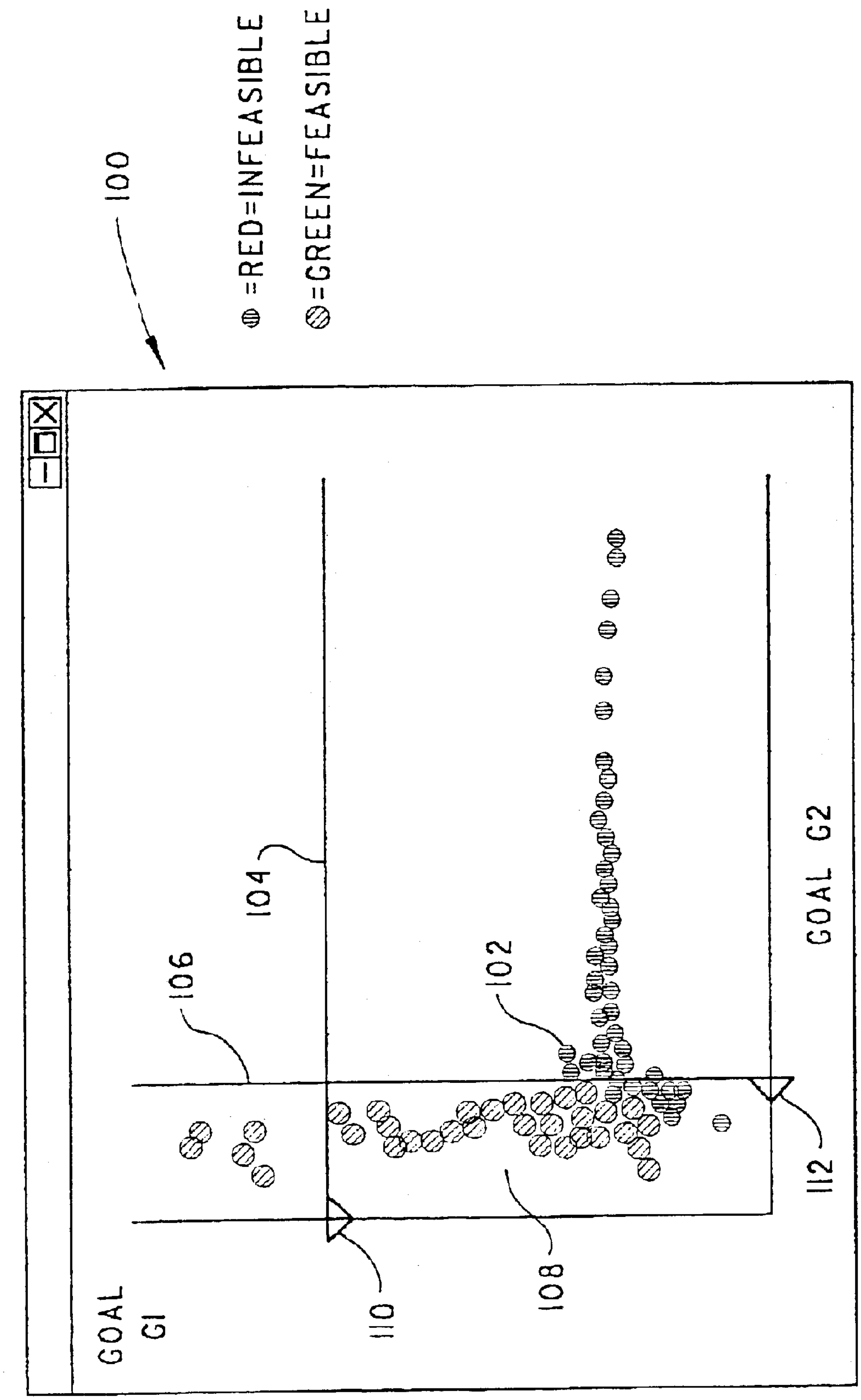
FIG. 9 is a goal versus goal chart displayed in response to selecting two goal axes in FIG. 8.

With reference to FIG. 9, and with continuing reference to FIGS. 3 and 8, the present invention is configured so that selecting two different goals in parallel goal coordinates chart 80 displays a goal versus goal chart 100. While goal versus goal chart 100 shows goal G1 versus G2, this is not to be construed as limiting the invention since the two selected goals do not need to be adjacent. Goal versus goal chart 100 includes indicia 102 for each design point D of FIG. 1. More specifically, each indicia 102 is positioned at the intersection of the value of goal G1 and the value of goal G2 for the corresponding design point D. Goal versus goal chart 100 can also include goal target lines 104 and 106 located on chart 100 at the target value for the corresponding goal. For example, as shown in FIG. 2, goal G1 has a target value of 0.1. Hence, in FIG. 9, target line 104 intersects the goal G1 axis at a value of 0.1. Similarly, in FIG. 2, goal G2 has a target value of 0.02. Hence, in FIG. 9, target line 106 intersects the goal G2 axis at a value of 0.02.

Each target line 104 and 106 can also be color coded in accordance with the type of constraint on the corresponding target value. For example, if a target line represents a strict constraint, such as greater than or less than, the line can be a first color, e.g., blue, whereas if a constraint is a preferential constraint, such as minimize or maximize, the line can be a second color, e.g., red.

The intersection of each target line 104 and 106 with its axis can include a suitable indicator 110 and 112, respectively, which can point toward goals having feasible values. The size of each indicia 102 can be a function of the cost associated with the corresponding design point. For example, indicia 102 having a large size can indicate a low cost and vice versa. The color of each indicia 102 can also indicate whether the corresponding design point is feasible or infeasible.

Utilizing goal versus goal chart 100, the designer can observe a feasibility region 108 for the two selected goals. To this end, if one of the two selected goals is the most important, then selection of a suitable indicia 102 in feasibility region 108 can be made. However, if other goals need to be considered, the designer can analyze relationships for those goals for different goal versus goal pairs in a manner shown in FIG. 9. Moreover, in a manner similar to a plurality of charts 60 to 66 in FIG. 7, a plurality of goal versus goal charts of the type shown in FIG. 9 can be concurrently displayed with indicia for each design point in each chart linked to indicia for the corresponding design point in the other charts. In this manner, the designer can analyze how changes in one pair of goals influence changes in another pair of goals.

Figure 10:
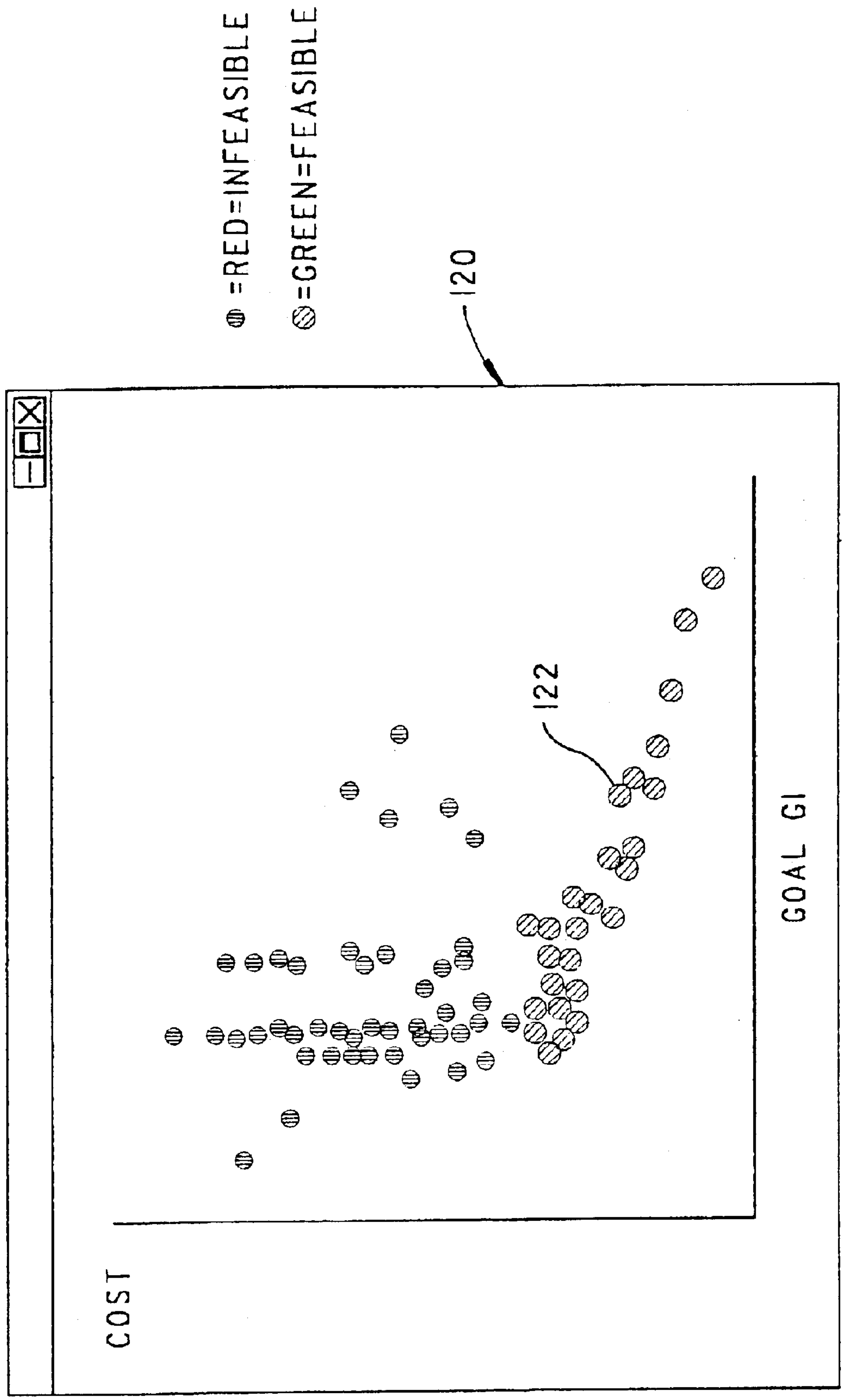
FIG. 10 is a cost versus goal chart displayed in response to selecting one goal axis in FIG. 8.

With reference to FIG. 10, and with continuing reference to FIG. 8, in response to selecting a single axis of parallel goal coordinates chart 80 twice in succession, a cost versus goal chart 120 is displayed. For example, if the goal G1 axis in FIG. 8 is selected twice in succession, cost versus goal chart 120 is displayed.

Cost versus goal chart 120 includes indicia 122 positioned at the intersection of the value of the cost and the value of the goal for each design point D in FIG. 1. Indicia 122 representing feasible design points can have a first, e.g., green, color while indicia 122 representing infeasible design points have a second, e.g., red, color. The size of each indicia 122 in chart 120 can be the same or feasible design points can have a different size than infeasible design points. As can be seen in cost versus goal chart 120, the cost value C decreases as the value of goal G1 increases. The same effect can also be observed in FIG. 9 if the size of each indicia 102 is related to the cost associated with the corresponding design point.

Other goals can also influence the cost function in an opposite direction from goal G1. To gain additional insight into influences of other goals to the cost function, the designer can use multiple cost versus goal charts with linked views and select different indicia on different charts to observe changes across different coordinates in a manner similar to that discussed above in connection with charts 60 to 66 in FIG. 7. Alternatively, the designer can return to visual filtering by cost utilizing cost range slider 84 of parallel goal coordinates chart 80.

Figure 11:
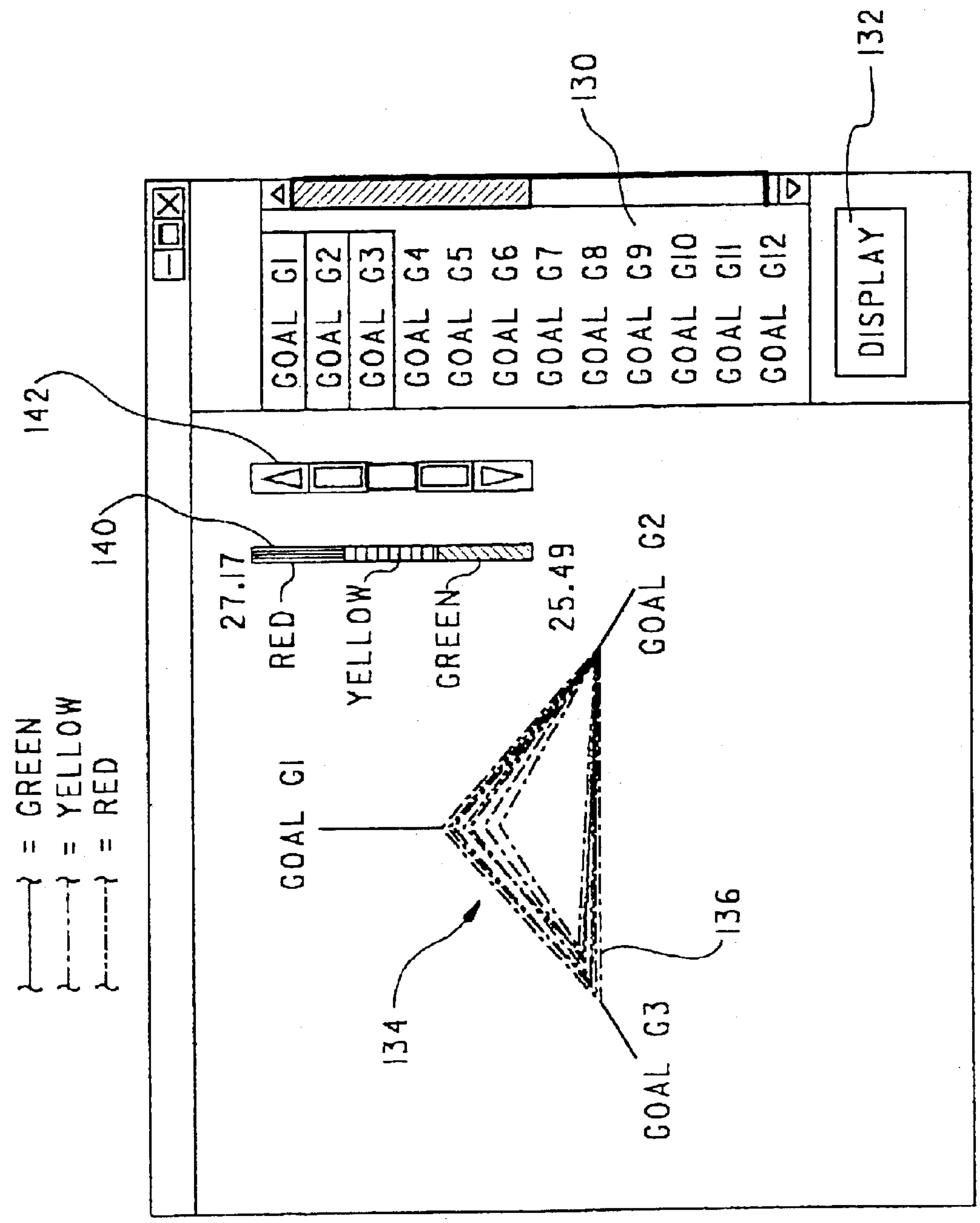
FIG. 11 is a radar chart that displays the relationships between three goals and design points shown in FIG. 1.

With reference to FIG. 11, and with continuing reference to FIG. 3, in response to selecting corners button 14, a goal selection menu 130 and a display button 132 are displayed. In response to selecting three goals, e.g., goal G1, G2, and G3, in goal selection menu 130 and thereafter activating display button 132, a radar chart 134 is displayed where each goal is represented by an axis that extends radially from a common center. It is desirable in radar chart 134 that each axis extends in a different direction to facilitate discrimination among lines 136 representing design points D in FIG. 1. In the example shown in FIG. 11, the three axes are spaced 120° relative to each other. However, this is not to be construed as limiting the invention since the number of goals selected in goal selection menu 130 will determine the number of axes and their angular spacing with respect to each other around the common center.

Each line 136 can be color coded based on its cost. For example, a first color, e.g., green, can be utilized to indicate a more favorable cost, a second color, e.g., red, can be utilized to indicate a less favorable cost and a third color, e.g., yellow, can be utilized to indicate an intermediate cost.

A color bar 140 and a cost-range slider 142 can be provided and used in the manner described above for color bar 84 and cost range slider 86 in FIG. 8 for filtering cost and goals based on color.

Because of imperfect manufacturing processes and real world environmental conditions, a designer typically validates a design across several different corners. For example, if a design is expected to work at temperatures between 0° C. and 100° C., the designer will simulate the design at least at the two extremes or corners, 0° C. and 100° C. Hence, in radar chart 134, one goal axis will be for 0° C. and another goal axis will be for 100° C. The third axis can then be another goal such, as the minimum operating voltage.

Axes of radar chart 134 can also be specified using more than one manufacturing or environmental condition. For example, if a circuit must work between 0° C. and 100° C. and between 2 volts and 2.5 volts, radar chart 134 will have four corners, namely, 0° C. at 2 volts; 0° C. at 2.5 volts; 100° at 2 volts; and 100° C. at 2.5 volts.

Because of the exponential growth in the number of corners when considering different manufacturing and environmental conditions, typically, between one and ten corners are chosen. These corners are representative corners. However, this number of corners is not to be construed as limiting the invention. Once the goal meets these corners, there is a good chance that the goal will meet all corners. Once an initial design process is complete, the design may be further validated across all or a larger set of corners to ensure that the circuit works correctly.

It has been observed that it is often difficult to meet a goal value for a particular corner. This can occur for several reasons. One reason may be that the design is overly sensitive at a particular corner. Another may be that redesigning the circuit to meet a goal at one corner can hurt the performance in another corner thus causing a design, redesign, "ping pong" effect that wastes time. Radar charts of the type shown in FIG. 11 can help provide design insight into how a goal is changing from one corner to the next. Specifically, a designer focusing on one corner of radar chart 134 can observe the relationship in the other corners of the radar chart. This enables the designer to observe, among other things, whether the goal at a particular corner is overly sensitive or if there is an inverse relationship between two corners. An inverse relationship implies that there are two competing comers. This could signify a "ping pong" condition. Another important observation that can be made from radar chart 134 is the relative values for a goal at each corner. This enables assessment of how much a goal value changes when moving from one corner to another.

Figure 12:
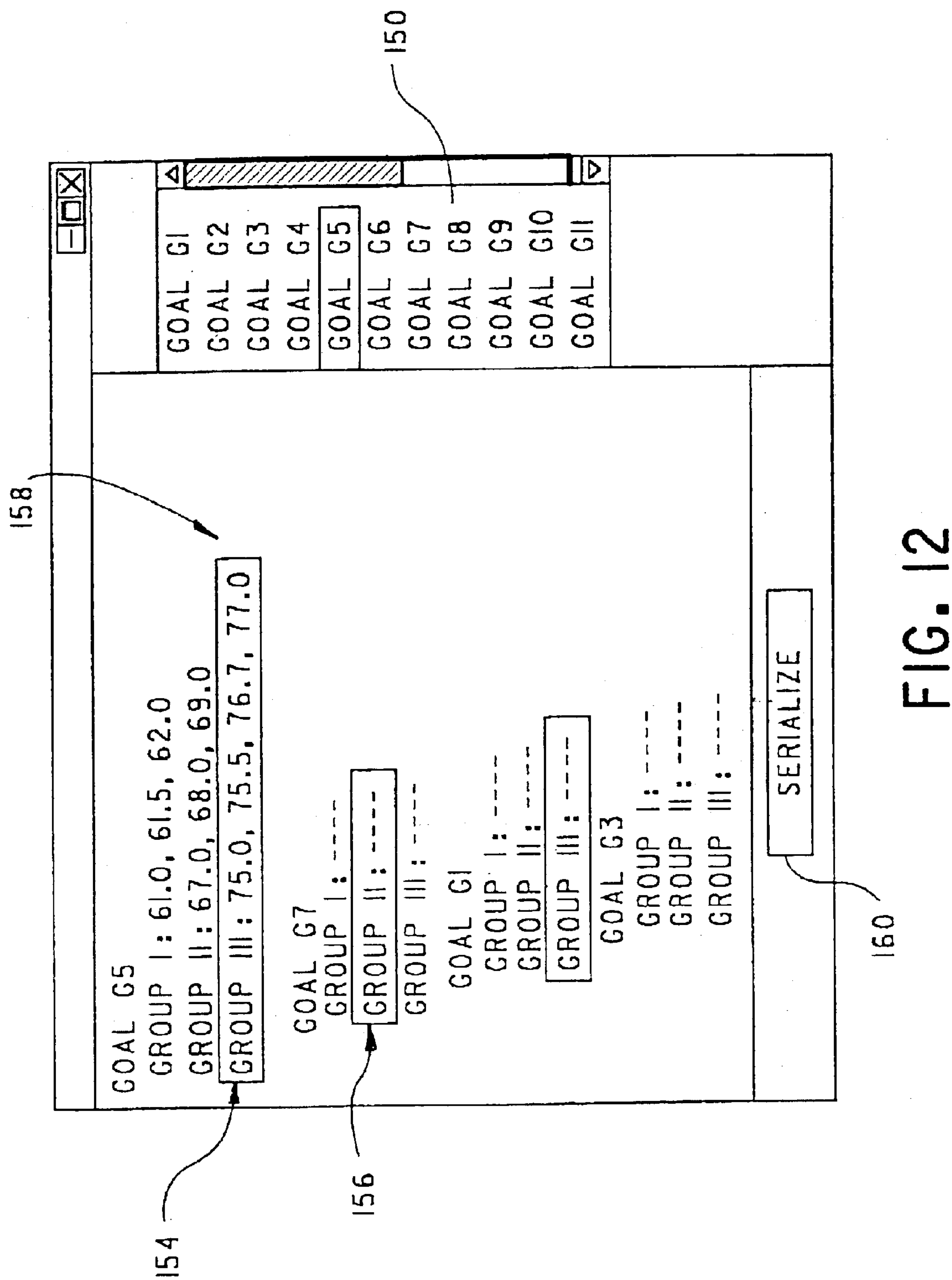
FIG. 12 shows grouping of goals of selected design points into plural groups as a function of the proximity of the value of the goal for each design point with respect to each other.

With reference to FIG. 12, and with continuing reference to FIG. 3, in response to selecting cluster button 16, a goal selection menu 150 is displayed. Goal selection menu 150 is configured so that only one goal at a time can be selected. Once a goal in goal selection menu 150 has been selected, the values of the selected goal for all of the design points D are clustered into two or more groups 154 as a function of their values and these groups 154 are displayed. For example, as shown in FIG. 12, in response to selecting goal G5 in goal selection menu 150, the values of goal G5 for ten different design points are grouped together, as shown, into Groups I, II and III. However, the number of groups can be changed if desired. The number of groups can be determined automatically or manually. In the example shown in FIG. 12, values of the selected goal are grouped into three separate groups or clusters. The labels "Group I", "Group II" and "Group III" are assigned to each cluster according to the values of the goal.

At this point, selection can be made of which group best suits the requirements of the circuit design. For example, for operational amplifiers, it is common to choose a high gain group because the goal is to have gain as high as possible. Hence, if goal G5 in FIG. 12 is the gain goal, Group III is selected. This selection reduces the number of design points for further exploration.

Next, the same or another goal can be selected in goal selection menu 150. If the same goal, i.e., goal G5, is selected, the values of the selected goal for all of the design points D associated with selected group 154 are clustered into two or more groups (not shown) as a function of their values and these groups are displayed. However, if a different goal, e.g., goal G7, is selected, the values of the selected goal for all of the design points D associated with selected group 154 are clustered into two or more groups 156 as a function of the values of goal G7 for these design points D and these groups 156 are displayed. The sequential selection of the same or different goals in goal selection menu 150 forms the clustering tree 158 shown in FIG. 12. The process of selecting one of the displayed groups at each level of incremental clustering tree 158 continues until a desired number of design points D have been isolated.

Concurrent with the selection of each new goal in goal selection menu 150, a parallel goal coordinates chart, of the type shown in FIG. 8, which includes for each goal selected in goal selection menu 150 a parallel axis and a line for each design point D of the selected group in the lowest level of incremental clustering tree 158, can be displayed.

A serialize button 160 can be selected for saving the search strategy displayed in incremental clustering tree 158 to a file for subsequent retrieval and analysis.

As an alternative to producing incremental clustering tree 158 in the above described manner, a simple script file (not shown) can be prepared that includes the order of importance of analyzed goals and the desired range of values for each goal. In response to activating cluster button 16 in FIG. 3, the script file can be executed to produce an incremental clustering tree, like incremental clustering tree 158, but without having to incrementally select goals in the manner described above.

The present invention has been described with reference to the preferred embodiment. Obvious modifications and alterations will occur to others upon reading and understanding the preceding detailed description. It is intended that the invention be construed as including all such modifications and alterations insofar as they come within the scope of the appended claims or the equivalents thereof.

The invention claimed is:

1. A method of selecting one of a plurality of circuit design points to utilize for implementing a circuit, the method comprising:

(a) providing a database having a plurality of design points for a circuit, with each design point determined as a function of a set of goals for the circuit and a set of variables for the circuit, with each design point having a value of at least one goal or one variable different from each other design point;

(b) determining a cost for each design point as a function of the set of goals for the circuit;

(c) displaying a cost versus design point chart having an indicia at the intersection of each cost-design point pair;

(d) selecting a plurality of indicia in the cost versus design point chart;

(e) displaying at least one of the following:

(1) at least one goal-variable chart that includes an indicia for the value of the goal and the value of the variable of each design point associated with the selected indicia in the cost versus design point chart;

(2) a parallel goal coordinates chart having a plurality of spaced parallel axes each associated with one of the set of goals, with the range of values of each axis related to the range of values of the corresponding goal of the design points associated with the selected indicia in the cost versus design point chart, the parallel goal coordinates chart including for each design point associated with the selected indicia in the cost versus design point chart a line extending through the parallel goal coordinates chart and intersecting each axis at the value of the corresponding goal for the design point; and (3) a radar chart having at least three radially extending axes, with each axis representing one of the set of goals, the radar chart including for each design point associated with the selected indicia in the cost versus design point chart a line intersecting each axis at the value of the corresponding goal for the design point; and (f) determining from the at least one chart displayed in step (e), which design point to utilize to implement the circuit.

2. The method of claim 1, wherein step (e) includes displaying at least one goal-variable chart and the method further includes:

determining at least one of a sensitivity and a correlation for each goal-variable pair associated with each design point associated with the indicia selected in step (d) wherein each goal-variable pair includes corresponding values for the goal and the variable associated with the design point;

selecting a first goal-variable pair based on at least one of the sensitivity and the correlation therefor;

selecting a second goal-variable pair based on at least one of the sensitivity and the correlation therefor;

displaying a first goal-variable chart that includes for each design point of the first goal-variable pair an indicia related thereto;

displaying a second goal-variable chart that includes for each point of the second goal-variable pair an indicia related thereto;

selecting one of the indicia in the first goal-variable chart, whereupon a first goal-variable pair of one of the design points is selected; and responsive to the selection of the indicia in the first goal-variable chart, highlighting in the second goal-variable chart the indicia corresponding to the selected design point.

3. The method of claim 2, further including:

selecting one goal-variable pair of the set of goals and the set of variables associated with at least the design points associated with the selected indicia;

determining for each design point associated with the selected indicia the value of the goal and the value of the variable for the selected one goal-variable pair;

determining variables of a best fit curve equation that represents a best fit line for the thus determined goal and variable values of each design point; and at least one of:

(1) determining the sensitivity of the selected goal-variable pair as a function of the best fit line; and (2) determining the correlation of the selected goal-variable pair as a function of the distribution of the goal and variable values of the one goal-variable pair for each design point about the best fit line.

4. The method of claim 3, wherein the sensitivity for the selected goal-variable pair is determined utilizing the equation:

$$S=S_{xy}/S_{xx}$$

wherein $$S_{xy}=\sum_{i=1}^{n}x_iy_i-(\Sigma x_i)(\Sigma y_i)/n;$$

$$S_{xx}=\sum_{i=1}^{n}x_i^2-(\Sigma x_i)^2/n;$$

S=sensitivity;

i=design point number;

n=total number of design points;

$x_i$=variable value of design point i; and $y_i$=goal value of design point i.

5. The method of claim 3, wherein the correlation for the selected goal-variable pair is determined utilizing the equation:

$$r=S_{xy}/(S_{xx}S_{yy})^{1/2}$$

where $$S_{xy}=\sum_{i=1}^{n}x_iy_i-(\Sigma x_i)(\Sigma y_i)/n;$$

$$S_{xx}=\sum_{i=1}^{n}x_i^2-(\Sigma x_i)^2/n;$$

$$S_{yy}=\sum_{i=1}^{n}y_i^2-(\Sigma y_i)^2/n;$$

r=correlation;

i=design point number;

n=total number of design points;

$x_i$=variable value of design point i; and $y_i$=goal value of design point i.

6. The method of claim 3, wherein:

the best fit curve equation is: $y_i=b_0+b_1x_i$; and the values of variables $b_0$ and $b_1$ are determined utilizing regression analysis.

7. The method of claim 1, further including:

associating a constraint with at least one goal of a design point;

classifying each design point as feasible where each constraint of e design point is satisfied; and classifying each design point as infeasible where at least one constraint of the design point is not satisfied.

8. The method of claim 7, wherein, in the cost versus design point chart, each indicia associated with a feasible design point has a first appearance and each indicia associated with an infeasible design point has a second appearance.

9. The method of claim 1, wherein the cost in step (b) is determined utilizing the equation:

$$Cost=\sum_{i=1}^{n}f(G_i)(w_i)$$

where i=design point number;

n=total number of design points;

$G_i$ are goals related to the cost;

$w_i$ are weights used to weigh the contribution of each goal; and $f(G_i)$ is an objective function that is utilized to determine the extent to which the corresponding goal is satisfied.

10. The method of claim 1, wherein step (e) includes displaying the parallel goal coordinates chart and step (f) includes detecting a relationship between at least two design points from the parallel goal coordinates chart.

11. The method of claim 1, wherein step (e) includes displaying the parallel goal coordinates chart and the method further includes at least one of:

responsive to selecting first and second lines of the parallel goal coordinates chart corresponding to first and second goals, respectively, displaying a first goal versus second goal chart that includes indicia for each design point; and responsive to selecting one line of the parallel goal coordinates chart twice in succession, displaying a cost versus goal chart that includes indicia for each design point.

12. The method of claim 1, wherein step (e) includes displaying the parallel goal coordinates chart and the method further includes:

selecting plural pairs of spaced parallel lines of the parallel goal coordinates chart thereby selecting a like plurality of goal pairs;

displaying a like plurality of goal pair charts, each of which includes indicia for each design point;

selecting one goal pair in one of the goal pair charts, wherein the selected goal pair corresponds to one of the design points; and responsive to the selection of the one goal pair, highlighting a goal pair for the same design point in another goal pair chart.

13. The method of claim 1, wherein step (e) includes displaying the parallel goal coordinates chart and the method further includes:

responsive to selecting one line of the parallel goal coordinates chart twice in succession, displaying a cost versus goal chart that includes indicia for each design point;

responsive to selecting another line of the parallel goal coordinates chart twice in succession, displaying another cost versus goal chart that includes indicia for each design point;

selecting one cost-goal pair in one of the cost versus goal charts, wherein the selected cost-goal pair corresponds to one of the design points; and responsive to the selection of the one cost-goal pair, highlighting a cost-goal pair for the same design point in the other cost versus goal chart.

14. The method of claim 1, further including determining for at least one line of the radar chart a relationship between the goals represented by at least two axes of the radar chart based on where the design point line intersects the at least two axes.

15. A computer readable medium having stored thereon instructions which, when executed by a processor, cause the processor to perform the steps of:

(a) display a cost versus design point chart that includes an indicia at the intersection of each cost-design point pair for a circuit, with each design point determined as a function of a common set of variables and a common set of goals for the circuit where a value of at least one variable or goal of each design point is different than the values of the variables and goals for each other design point, with each cost determined as a function of the values of the goals for the corresponding design point;

(b) receive a selection of a plurality of indicia in the cost versus design point chart; and (c) display at least one chart having one of an indicia and a line for each design point associated with the selected indicia in the cost versus design point chart, each of the at least one chart having axes for one of (1) one goal-variable pair; (2) plural goals of the set of goals; and (3) one cost-goal pair, wherein the at least one displayed chart enables selection of one of the design points to utilize for implementing the circuit.

16. The computer readable medium of claim 15, wherein the instructions cause the processor to perform the steps of:

display a goal versus variable matrix for the design points associated with the indicia selected in step (b), the goal versus variable matrix including in each cell thereof at least one of a sensitivity value and a correlation value for the corresponding goal-variable pair;

receive a selection of first and second goal-variable pairs in the goal versus variable matrix;

responsive to receiving the selection of the first and second goal-variable pairs, displaying first and second goal-variable chart, with each goal-variable chart including for the goal-variable pair represented thereby an indicia at the intersection of the value of the goal and the value of the variable of each design point associated with the indicia selected in step (b);

receive a selection of one of the indicia in the first goal-variable chart whereupon one of the design points is selected; and responsive to receiving the selection of the one indicia in the first goal-variable chart, highlight in the second goal-variable chart the indicia for the value of the goal and the value of the variable for the same design point.

17. The computer readable medium of claim 16, wherein the instructions cause the processor to perform the steps of:

receive a selection of at least one goal-variable pair of the set of goals and the set of variables associated with the design points associated with the indicia selected in step (b);

for the selected goal-variable pair, identifying the value of the goal and the value of the variable for each design point associated with the indicia selected in step (b);

determine for the selected goal-variable pair variables for a best fit curve equation that represents a best fit line for the thus identified goal and variable values of each design point associated with the indicia selected in step (b); and at least one of:

(1) determine the sensitivity of the selected goal-variable pair as a function of the best fit line; and (2) determine the correlation of the selected goal-variable pair as a function of the distribution about the best fit line of the goal and variable values of the one goal-variable pair of each design point associated with the indicia selected in step (b).

18. The computer readable medium of claim 15, wherein, in step (c), the chart of plural goals of the set of goals includes:

a coordinate axis for each of at least three goals of the circuit, with the coordinate axes having a predetermined relation to each other; and a line for each design point associated with the indicia selected in step (b), with each line intersecting each coordinate axis at a value that corresponds to the value of the corresponding goal for the design point.

19. The computer readable medium of claim 18, wherein the chart of plural goals of the set of goals includes at least one of:

a parallel goal coordinates chart having the axes positioned in spaced parallel relation; and a radar chart having the axes extending radially from a common center.

* * * * *